United States Patent
Zhang et al.

(10) Patent No.: US 11,349,489 B2
(45) Date of Patent: May 31, 2022

(54) ERROR EXTRACTION METHOD FOR FOREGROUND DIGITAL CORRECTION OF PIPELINE ANALOG-TO-DIGITAL CONVERTER

(71) Applicants: NO.24 RESEARCH INSTITUTE OF CHINA ELECTRONICS TECHNOLOGY GROUP CORPORATION, Chongqing (CN); CHONGQING GIGACHIP TECHNOLOGY CO. LTD., Chongqing (CN)

(72) Inventors: Yong Zhang, Chongqing (CN); Ting Li, Chongqing (CN); Zhengbo Huang, Chongqing (CN); Yabo Ni, Chongqing (CN); Dongbing Fu, Chongqing (CN)

(73) Assignees: NO.24 RESEARCH INSTITUTE OF CHINA ELECTRONICS TECHNOLOGY GROUP CORPORATION, Chongqing (CN); CHONGQING GIGACHIP TECHNOLOGY CO. LTD., Chongqing (CN)

(*) Notice: Subject to any disclaimer, the term of this patent is extended or adjusted under 35 U.S.C. 154(b) by 0 days.

(21) Appl. No.: 17/602,994
(22) PCT Filed: Jan. 7, 2020
(86) PCT No.: PCT/CN2020/070599
§ 371 (c)(1),
(2) Date: Oct. 11, 2021
(87) PCT Pub. No.: WO2020/211480
PCT Pub. Date: Oct. 22, 2020

(65) Prior Publication Data
US 2022/0094366 A1    Mar. 24, 2022

(30) Foreign Application Priority Data
Apr. 17, 2019    (CN) .......................... 201910309148.6

(51) Int. Cl.
*H03M 1/06* (2006.01)
*H03M 1/16* (2006.01)

(52) U.S. Cl.
CPC ....... *H03M 1/0604* (2013.01); *H03M 1/0695* (2013.01); *H03M 1/164* (2013.01)

(58) Field of Classification Search
CPC ... H03M 1/0604; H03M 1/0695; H03M 1/164
See application file for complete search history.

(56) References Cited

U.S. PATENT DOCUMENTS

| 6,838,937 B2 | 1/2005 | Fanous et al. | |
|---|---|---|---|
| 7,595,744 B2* | 9/2009 | Agarwal | H03M 1/0624 341/118 |
| 8,754,794 B1* | 6/2014 | Li | H03M 1/1057 341/120 |

FOREIGN PATENT DOCUMENTS

| CN | 107359878 A | 11/2017 |
|---|---|---|
| CN | 107453756 A | 12/2017 |
| CN | 110061743 A | 7/2019 |

* cited by examiner

*Primary Examiner* — Khai M Nguyen
(74) *Attorney, Agent, or Firm* — Global IP Services; Tianhua Gu

(57) ABSTRACT

An error extraction method for foreground digital correction of a pipeline analog-to-digital converter including: acquiring a transmission curve of a pipeline analog-to-digital converter, and controlling an input signal to be within a subsegment 0 of the transmission curve; during extraction of error information of an ith pipeline stage, setting a magnitude of the input signal according to Formula (I); locking the outputs of all previous-stage comparators in the $i^{th}$ pipeline stage of the pipeline analog-to-digital converter; and completing, according to original output code of the pipeline analog-to-digital converter, error extraction by means of adaptive iteration, stage-by-stage, sequentially from a last stage to a first stage of a pipeline. During quantization of (Continued)

error value, the invention performs, by means of a fitting-based adaptive algorithm, foreground extraction of a capacitance mismatch error, a gain bandwidth error, and a kickback error in each stage of the pipeline, without any additional circuit.

17 Claims, 3 Drawing Sheets

ERROR EXTRACTION METHOD FOR FOREGROUND DIGITAL CORRECTION OF PIPELINE ANALOG-TO-DIGITAL CONVERTER

CROSS REFERENCE TO RELATED PATENT APPLICATION

The present application is the US national stage of PCT/CN2020/070599 filed on 2020 Jan. 7, which claims the priority of the Chinese patent application No. 201910309148.6 filed on 2019 Apr. 17, which application is incorporated herein by reference.

TECHNICAL FIELD

The present invention relates to the field of electronics, and particularly relates to an error extraction method for foreground digital correction of a pipeline analog-to-digital converter.

BACKGROUND

An architecture of a pipeline analog-to-digital converter (ADC) is generally formed by cascading N low-resolution stage circuits. After an input signal is quantized by the first stage, a $n_1$-bit low-resolution quantization result is obtained, at the same time, an amplified margin is output to the second stage, by parity of reasoning, each stage produces an $n_i$ (i=1-N)-bit low-resolution quantization result, and the margin is output as the input of the next stage. N low-resolution quantization results are combined into the final digital output through misalignment overlapping. The stage circuit consists of subADC and MDAC. The subADC consists of a plurality of comparators to complete a low-resolution quantization function of the stage circuit. The MDAC further includes two functional modules: subDAC and OTA. The MDAC completes a margin amplification function in the stage circuit. The subDAC generally consists of a capacitor array. Due to manufacturing deviations, there is inherent mismatch between the capacitors. Therefore, a capacitance mismatch error may be introduced to deteriorate the linearity of the ADC, and digital trimming must be carried out.

At present, most high-speed pipeline ADCs are designed by adopting a 65 nm or 28 nm processes. Although MOS transistors on these process nodes have higher characteristic frequencies, their intrinsic gains are lower, and this will cause a huge challenge on the gain design of a key unit of an operational transconductance amplifier (OTA) in the MDAC. Additionally, when low power consumption needs to be considered in the ADC design, the OTA bandwidth design also becomes difficult. A feasible solution is to perform digital correction for insufficient gain and insufficient bandwidth, and additionally, the correction may be performed to a plurality of pipelined stage circuits at the same time, therefore lowering the difficulty of the OTA design and reducing the power consumption. In the traditional pipeline ADC design, a problem of kickback error is solved solely by a reset switch, but a time margin needs to be consumed. When a higher speed index is pursued, the kickback error also needs digital correction.

However, all of the above errors require digital correction, but it is still problematic to quantify an error value. According to traditional pipeline ADC foreground correction, a capacitance mismatch error and a gain bandwidth error of the first stage are generally extracted by means of integral nonlinear error (INL) measurement while the later stages are not processed. By means of the pipeline ADC background correction, a capacitance mismatch error, a gain bandwidth error and a kickback error of later stages can be extracted, but the increase of an analog auxiliary circuit and a large number of digital algorithm processing circuits are needed.

SUMMARY

In view of the above defects in the prior art, the present invention provides an error extraction method for foreground digital correction of a pipeline analog-to-digital converter to solve the above technical problems.

The error extraction method for foreground digital correction of a pipeline analog-to-digital converter provided by the present invention includes:

acquiring a transmission curve of a pipeline analog-to-digital converter, and controlling an input signal to be within a sub-segment 0 of the transmission curve;

during extraction of error information in an $i^{th}$ pipeline stage, setting the input signal according to:

$$Vin \leq \prod_{i=1}^{P-1} \frac{FS}{G_i}$$

where $G_i$ is a margin gain of the $i^{th}$ pipeline stage, FS is a full scale of the pipeline analog-to-digital converter, and P is a current error extraction stage number;

locking the outputs of all previous-stage comparators in the $i^{th}$ pipeline stage of the pipeline analog-to-digital converter; and completing, according to original output code of the pipeline analog-to-digital converter, error extraction by means of sequential adaptive iteration, stage-by-stage, from a last stage to a first stage of a pipeline.

Optionally, an actual output quantity of the pipeline analog-to-digital converter is acquired, and is fit to obtain an ideal output quantity of the pipeline analog-to-digital converter, and error extraction is completed by means of sequential adaptive iteration stage by stage sequentially from a last stage to a first stage of a pipeline according to the ideal output quantity of the pipeline analog-to-digital converter.

Optionally, a capacitance mismatch of each capacitor is extracted according to the following formula:

$$\Delta C_i(n) = \Delta C_i(n-1) - \mu_0 * B_i(n) * \varepsilon(n), \ i=1 \sim M$$

where M is a total number of capacitors of a current stage, $B_i$ is a baseline state in which an $i^{th}$ capacitor is accessed, $\mu_0$ is an iteration constant, $\Delta C_i$ is capacitance mismatch, and $\varepsilon(n)$ is a first conversion error.

Optionally, a gain error is extracted according to the following formula:

$$\Delta G(n) = \Delta G(n-1) - \mu_1 * \text{sign}(D_{res}(n)) * \varepsilon(n)$$

where $D_{res}$ is a numerical value of a residual error, $\mu_1$ is an iteration constant, $\Delta G$ is a gain error, and $\varepsilon(n)$ is a first conversion error.

Optionally, a kickback error is extracted through the following formulas:

$$K(n) = K(n-1) - \mu_2 * \text{sign}\left(\sum_{i=1}^{M} B_i(n) + \frac{M}{2}\right) * \varepsilon_{KB}(n)$$

$$K_1(n) = K_1(n-1) - \mu_3 * \text{sign}(\text{Dout}(n) - \text{Dout}(n-1)) * \varepsilon_{KB}(n)$$

where $\varepsilon_{KB}(n)$ is a second conversion error, Dout(n) represents a digital output of an $n^{th}$ sampling point, K(n) is a kickback error coefficient after the $n^{th}$ iteration, $K_1(n)$ is a fitting compensation coefficient after the $n^{th}$ iteration, and the second conversion error is acquired according to the following formula:

$$\varepsilon_{KB}(n) = \varepsilon(n) - K(n) * \left(\sum_{i=1}^{M} B_i(n) + \frac{M}{2}\right) + K_1(n) * (Dout(n) - Dout(n-1))$$

Optionally, a correction value is acquired according to the following formula:

$$Dout\_cal = Dout + 0.5 * \sum_{i=1}^{M} \Delta C_i * B_i + \Delta G * D_{res} - K * \left(\sum_{i=1}^{M} B_i + \frac{M}{2}\right)$$

where Dout_cal is a numerical value after correction, Dout is a numerical value before correction, and M represents a total number of capacitors in the currently corrected stage.

Optionally, the first conversion error is:

$$\varepsilon(n) = Dout(n) + 0.5 * \sum_{i=1}^{M} \Delta C_i(n-1) * B_i(n) + \Delta G(n-1) * D_{res}(n) - fit(n)$$

where M is a total number of capacitors in the current stage, Bi is a baseline state in which an $i^{th}$ capacitor is accessed, $\Delta C_i$ is capacitance mismatch, Dres is a numerical value of a residual error, $\Delta G$ is a gain error, Dout(n) is a digital output of an $n^{th}$ sampling point, and fit(n) is an ideal output value of the $n^{th}$ sampling point of the analog-to-digital converter. Optionally, the pipeline analog-to-digital converter is an analog-to-digital converter with an original code output capability.

Optionally, the input signal is a low-frequency signal.

Optionally, the transmission curve of the pipeline analog-to-digital converter is subjected to expansion processing to obtain an expanded transmission curve, and the expansion processing includes adjusting threshold voltages of comparators at two ends of the sub-segment 0 of the transmission curve of the pipeline analog-to-digital converter to enable a residual error signal within the sub-segment 0 to be a full amplitude signal.

Optionally, the locking the outputs of the comparators in the pipeline analog-to-digital converter includes: completing output locking by adding offset by means of an offset input method for a comparator through an offset trimming circuit of the comparator.

Optionally, the locking the outputs of the comparators in the pipeline analog-to-digital converter includes: completing output locking by adopting forced setting to enable a value transmitted to a margin gain unit to be the same as a value of a comparator corresponding to the sub-segment 0.

The present invention has the beneficial effects: according to the error extraction method for foreground digital correction of a pipeline analog-to-digital converter in the present invention, during quantization of error value, the invention performs, by means of a fitting-based adaptive algorithm, foreground extraction of a capacitance mismatch error, a gain bandwidth error, and a kickback error in each stage of the pipeline without any additional circuit, thereby saving resources, realizing accurate quantization of error value, and accordingly facilitating digital correction of pipeline analog-to-digital converters.

DETAILED DESCRIPTION OF THE PREFERRED EMBODIMENTS

Figure 1:
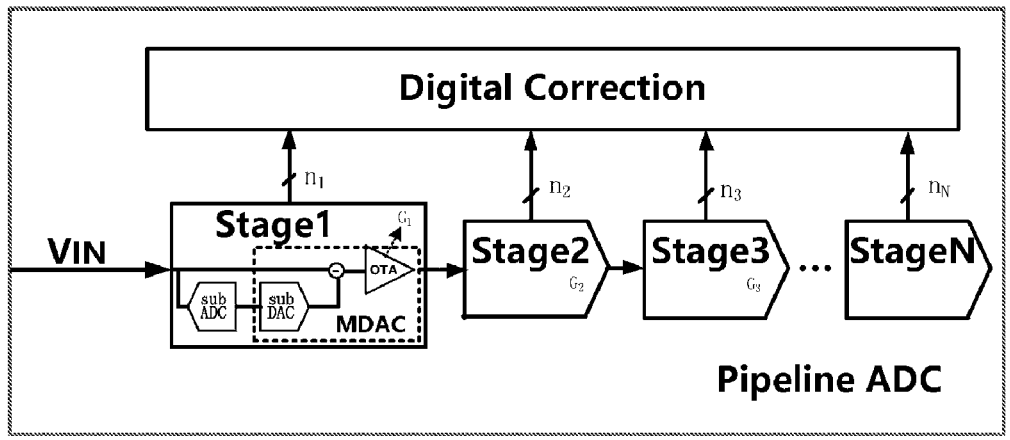
FIG. 1 is a schematic structural diagram of a pipeline analog-to-digital converter in an error extraction method for foreground digital correction of a pipeline analog-to-digital converter in an embodiment of the present invention.

The implementations of the present invention are described below through specific examples. Those skilled in the art can easily understand the other advantages and effects of the present invention from the content disclosed in this specification. The present invention may also be implemented or applied through other different specific implementations. Various details in this specification may also be modified or changed based on different viewpoints and applications without departing from the spirit of the present invention. It should be noted that the embodiments below and features in the embodiments can be combined with each other in the case of no conflict.

It should be noted that the drawings provided in the following embodiments only exemplify the basic idea of the present invention, so only the components related to the present invention are shown in the drawings, and the drawings are not drawn according to the numbers, shapes, and sizes of the components in practical implementations. In practice, the configurations, numbers, and scales of the components may be changed arbitrarily, and the layout and configuration of the components may be more complex.

Numerous details are described below, to provide a more thorough explanation for the embodiments of the present invention. However, it is obvious to those skilled in the art that the embodiments of the present invention may be implemented without such specific details. In some other embodiments, well-known structures and devices are shown via block diagrams rather than details, so as not to obscure the embodiments of the present invention.

An error extraction method for foreground digital correction of a pipeline analog-to-digital converter in the present embodiment includes:

a transmission curve of a pipeline analog-to-digital converter is acquired, and an input signal is controlled to be within a sub-segment 0 of the transmission curve;

during extraction of error information of an $i^{th}$ pipeline stage, a magnitude of the input signal is set according to:

$$Vin \leq \prod_{i=1}^{P-1} \frac{FS}{G_i}$$

where $G_i$ is a margin gain of the $i^{th}$ pipeline stage, and FS is a full scale of the pipeline analog-to-digital converter;

the outputs of all previous-stage comparators in the $i^{th}$ pipeline stage of the pipeline analog-to-digital converter are locked; and completing, according to original output code of the pipeline analog-to-digital converter, error extraction by means of adaptive iteration, stage-by-stage, sequentially from a last stage to a first stage of a pipeline.

Figure 3:
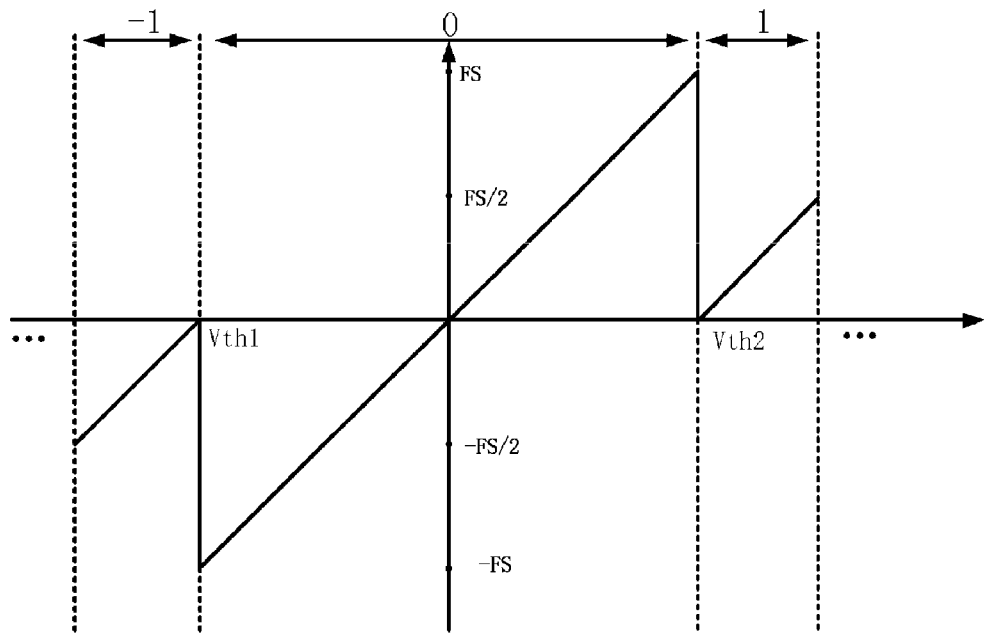
FIG. 3 is a schematic diagram of a transmission curve of a pipeline required for foreground correction in the error extraction method for foreground digital correction of a pipeline analog-to-digital converter in an embodiment of the present invention.

In the present embodiment, a structure of the pipeline analog-to-digital converter is as shown in FIG. 1. When an error of a certain pipeline stage is extracted, an extraction strategy is firstly completed stage by stage from a later stage to a previous stage so as to ensure that the later stage of the pipeline is ideal, and then needs to enable the error of the previous stage not to influence the linearity of a signal, thus enabling the error to be totally generated from an error source of the current pipeline stage. Comparators of the previous pipeline stage in the present embodiment need to have output locking capability, input signals are prevented from being among a plurality of segments of the transmission curve, and the introduction of a previous stage capacitance mismatch error is avoided. A normal transmission curve of a pipeline is as shown in FIG. 1. Input signals need to be totally within one sub-segment during the previous stage pipeline transmission, so that the input signals must be within a sub-segment 0 of the transmission curve, but an acquired residual error signal is only a half of a full amplitude, and half capacitors are in a fixed state. In order to extract mismatch information of all of the capacitors, two threshold voltages Vth 1 and Vth 2 of comparators of the sub-segment 0 need to be expanded, so that a full-amplitude signal can be seen in a later stage pipeline, and the modified transmission curve is as shown in FIG. 3. When extraction of error information of the $i^{th}$ pipeline stage is needed, a magnitude of the input signal needs to be set according to:

$$Vin \leq \prod_{i=1}^{P-1} \frac{FS}{G_i} \quad (1)$$

where $G_i$ is a margin gain of the $i^{th}$ pipeline stage, and FS is a full scale of the ADC.

Figure 2:
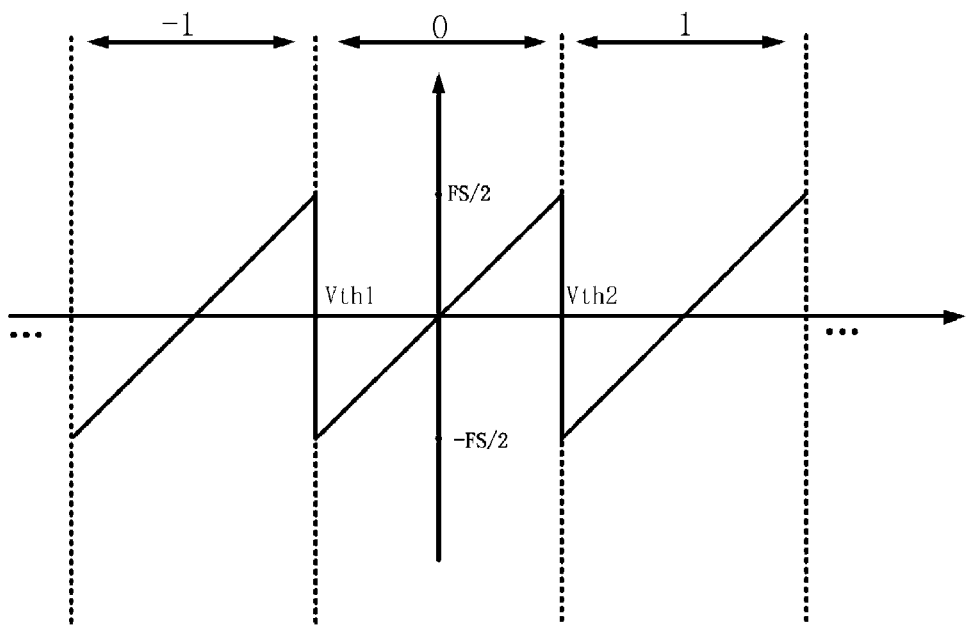
FIG. 2 is a schematic diagram of a normal transmission curve of a pipeline in the error extraction method for foreground digital correction of a pipeline analog-to-digital converter in an embodiment of the present invention.

In the present embodiment, an offset input method for comparators and a setting method may be adopted for locking the outputs of the comparators. From the transmission curve as shown in FIG. 2, it can be seen that locking the outputs of the comparators is equivalent to modifying thresholds of the comparators, which may be done simply by adding an offset, through an offset trimming circuit of the comparators.

Figure 4:
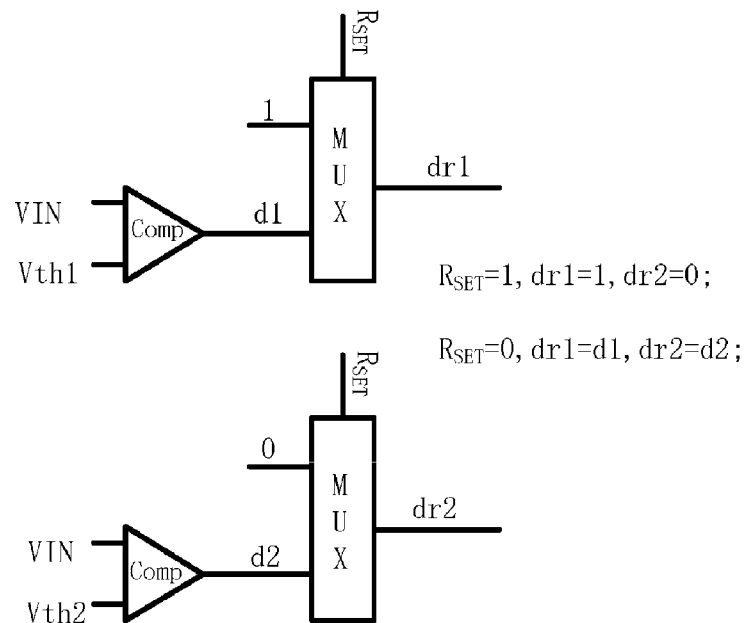
FIG. 4 is a schematic diagram of locking the outputs of comparators by a setting method in the error extraction method for foreground digital correction of a pipeline analog-to-digital converter in an embodiment of the present invention.

If the setting method is adopted for locking the outputs of the comparators, the increase of an auxiliary circuit is needed, as shown in FIG. 4, regardless of the outputs of the comparators, a forced setting$_{method}$ is adopted to enable all values transmitted to the MDAC to be equal to a value of a comparator corresponding to the sub-segment 0.

In the present embodiment, the insufficient OTA gain and insufficient OTA bandwidth can be equivalent to a gain error. When the kickback error is not considered and only the capacitance mismatch$_{and}$ the gain error are considered, the errors can be extracted according to the following manner:

An actual output quantity of the pipeline analog-to-digital converter is acquired, and is fit to obtain an ideal output quantity of the pipeline analog-to-digital converter, and error extraction is completed by means of adaptive iteration stage by stage sequentially from a last stage to a first stage of a pipeline according to the ideal output quantity of the pipeline analog-to-digital converter. After a sine signal is added to a certain pipeline stage, and due to the existence of an error source, there may be an error in an actual ADC output Dout. However, according to an unchanged system characteristic under the linear condition, the ideal ADC output is a sine signal, so that an ideal value of the ADC may be obtained through fitting of actual value Dout, and the fitted sine may be expressed as Formula (2):

$$fit = A*\cos(\omega*t_n) - B*\sin(\omega*t_n) - C \quad (2)$$

In the formula, $\omega$ is a frequency, A represents an amplitude of a cosine portion, B represents an amplitude of a sine portion, C represents an offset portion, and $t_n$ represents a sampling moment.

A sine initial phase may be equivalent to a superposition of a sine signal and a cosine signal.

Fitting parameters A, B and C can be obtained by calculating the sum of least mean square errors according to Formula (3):

$$\sum_{n=1}^{NM} [Dout[n] - A*\cos(\omega*t_n) - B*\sin(\omega*t_n) - C]^2 \quad (3)$$

In the present embodiment, supposed that initial values of the capacitance mismatch $\Delta C_i$ and the gain error $\Delta G$ are 0, a conversion error of different iteration serial numbers is obtained according to the capacitance mismatch $\Delta C_i$ and the gain error $\Delta G$ obtained through iteration:

$$\varepsilon(n) = \quad (4)$$

$$Dout(n) + 0.5*\sum_{i=1}^{M} \Delta C_i(n-1)*B_i(n) + \Delta G(n-1)*D_{res}(n) - fit(n)$$

The capacitance mismatch of each capacitor can be obtained through an adaptive algorithm, as shown in Formula (5):

$$\Delta C_i(n) = \Delta C_i(n-1) - \mu_0*B_i(n)*\varepsilon(n), i=1\sim M \quad (5)$$

In the formula, M is a total number of capacitors in a current stage, $B_i$ is a baseline state in which an $i^{th}$ capacitor is accessed, $B_i=1$ represents a positive baseline state accessed, $B_i=-1$ represents a negative baseline state accessed, and $\mu_0$ is an iteration constant.

The gain error can be obtained through an adaptive algorithm, as shown in Formula (6):

$$\Delta G(n) = \Delta G(n-1) - \mu_1 * \text{sign}(D_{res}(n)) * \varepsilon(n) \quad (6)$$

In the formula, $D_{res}$ represents a numerical value of a residual error, and a new iteration constant $\mu_1$ needs to be adopted due to different influences of the gain and capacitor on the digital output.

Figure 5:
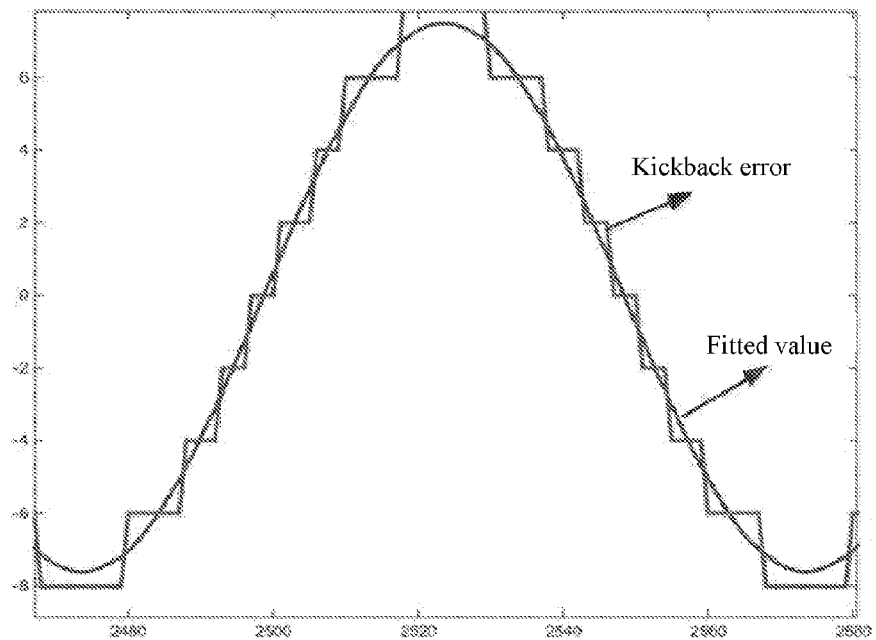
FIG. 5 is a schematic diagram of a kickback error and a fitted value in the error extraction method for foreground digital correction of a pipeline analog-to-digital converter in an embodiment of the present invention.
Figure 6:
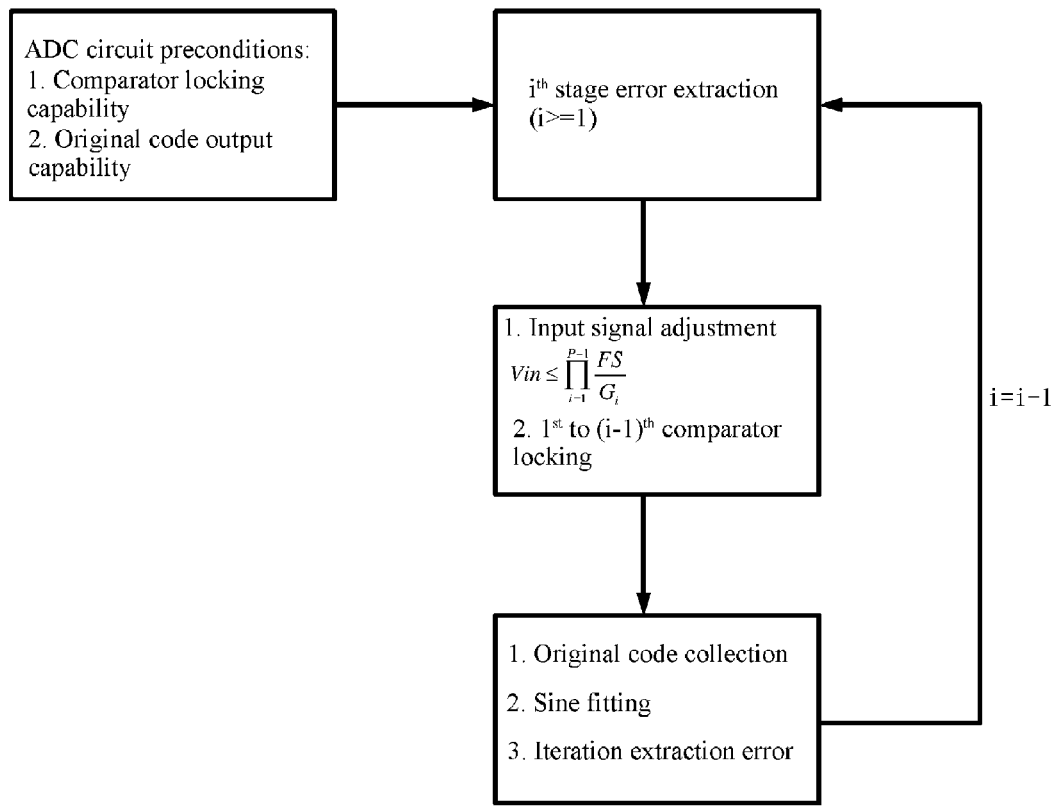
FIG. 6 is a schematic diagram of an error extraction process in the error extraction method for foreground digital correction of a pipeline analog-to-digital converter in an embodiment of the present invention.

The kickback error is relevant to the digital code $B_i$ of the previous sampling point, has a memory effect, and may thus influence a phase of a fitting signal. Secondly, the digital code $B_i$ has M+1 possibilities, the fitting signal is a smooth signal, its relationship is as shown in FIG. 5, and the conversion error cannot approach to 0 all the time regardless of the iteration times. Therefore, during extraction of kickback error, the conversion error needs to be modified by calculation according to Formula (7):

$$\varepsilon_{KB}(n) = \varepsilon(n) - K(n) * \left(\sum_{i=1}^{M} B_i(n) + \frac{M}{2}\right) + K_1(n) * (Dout(n) - Dout(n-1)) \quad (7)$$

In the formula, the second item of Formula (7) is used to counteract the kickback error of the signal, the third item of Formula (7) is approximately a sine signal at low-frequency signal input, and is used to compensate the phase deviation of the fitting signal caused by the kickback error. Therefore, the two error parameters need to be iterated at the same time, as shown in Formula (8) and Formula (9), and additionally, the input signal needs to be defined to be a low-frequency signal:

$$K(n) = K(n-1) - \mu_2 * \text{sign}\left(\sum_{i=1}^{M} B_i(n) + \frac{M}{2}\right) * \varepsilon_{KB}(n) \quad (8)$$

$$K_1(n) = K_1(n-1) - \mu_3 * \text{sign}(Dout(n) - Dout(n-1)) * \varepsilon_{KB}(n) \quad (9)$$

After all error extraction is completed, a correction value may be expressed as Formula (10):

$$\text{Dout\_cal} = Dout + 0.5 * \sum_{i=1}^{M} \Delta C_i * B_i + \Delta G * D_{res} - K * \left(\sum_{i=1}^{M} B_i + \frac{M}{2}\right) \quad (10)$$

In the present embodiment, the ADC needs to have an original code output capability, and the actual work state of each capacitor, represented by $B_i$, cannot be reproduced by the data after misalignment overlapping.

In the foregoing embodiments, unless otherwise specified, sequence numbers such as "first" and "second" are used for describing identical objects and only represent different examples of the same object, but are not intended to indicate that the described objects must follow a given sequence, whether in time, in space, in order, or in any other manners.

In the foregoing embodiments, the terms such as "this embodiment", "the present embodiment", "the embodiment", "an embodiment", "one embodiment", "another embodiment", or "other embodiments" in this specification mean that specific features, structures, or properties described with reference to the embodiment(s) are included in at least some embodiments, but are not necessarily included in all the embodiments. Also, repeated occurrences of such terms in this specification do not necessarily refer to the same embodiment(s). If it is described in this specification that a component, feature, structure, or property "may", "perhaps", or "can" be/is included, the specific component, feature, structure, or property "may", "may be", or "can" be included, it does not mean that this specific component, feature, structure, or property must be included. If "an" element or "a" unit is mentioned in the specification or claims, it does not mean that only one said element or unit exists. If "an other" or "another" element is mentioned in the specification or claims, the possibility of presence of more than one other elements is not excluded.

The above embodiments only exemplarily illustrate the principles and effects of the present invention, but are not used to limit the invention. Any person skilled in the art may make modifications or changes on the foregoing embodiments without departing from the spirit and scope of the present invention. Therefore, all equivalent modifications or changes made by a person of ordinary skill in the art without departing from the spirit and technical idea of the present invention shall be covered by the claims of the present invention.

What is claimed is:

1. An error extraction method for foreground digital correction of a pipeline analog-to-digital converter, comprising:
    acquiring a transmission curve of a pipeline analog-to-digital converter, and controlling an input signal to be within a sub-segment 0 of the transmission curve;
    during extraction of error information in an $i^{th}$ pipeline stage, setting a magnitude of the input signal according to:

$$Vin \leq \prod_{i=1}^{P1} \frac{FS}{G_i}$$

wherein $G_i$ is a margin gain of the $i^{th}$ pipeline stage, FS is a full scale of the pipeline analog-to-digital converter, and P is a stage number of the current error extraction;
    locking the outputs of all previous-stage comparators in the $i^{th}$ pipeline stage of the pipeline analog-to-digital converter; and
    completing, according to original output code of the pipeline analog-to-digital converter, error extraction by means of adaptive iteration, stage-by-stage, sequentially from a last stage to a first stage of a pipeline.

2. The error extraction method for foreground digital correction of a pipeline analog-to-digital converter according to claim 1, wherein an actual output quantity of the pipeline analog-to-digital converter is acquired, and is fit to obtain an ideal output quantity of the pipeline analog-to-digital converter, and error extraction is completed by means of adaptive iteration stage by stage sequentially from a last stage to a first stage of a pipeline according to the ideal output quantity of the pipeline analog-to-digital converter.

3. The error extraction method for foreground digital correction of a pipeline analog-to-digital converter according to claim 2, wherein a correction value is acquired according to the following formula:

$$\text{Dout\_cal} = Dout + 0.5 * \sum_{i=1}^{M} \Delta C_i * B_i + \Delta G * D_{res} - K * \left(\sum_{i=1}^{M} B_i + \frac{M}{2}\right)$$

where Dout_cal is a numerical value after correction, Dout is a numerical value before correction, and M represents a total number of capacitors in the currently corrected stage.

4. The error extraction method for foreground digital correction of a pipeline analog-to-digital converter according to claim 1, wherein a capacitance mismatch of each capacitor is extracted according to the following formula:

$$\Delta C_i(n) = \Delta C_i(n-1) - \mu_0 * B_i(n) * \varepsilon(n), i = 1 - M$$

wherein M is a total number of capacitors of a current stage, Bi is a baseline state in which an $i^{th}$ capacitor is accessed, Bi is 1 when accessed in a positive baseline state, and Bi is −1 when accessed in a negative baseline state, $\mu 0$ is an iteration constant, $\Delta C_i$ is capacitance mismatch, $\varepsilon(n)$ is a first conversion error, and n is an iteration serial number.

5. The error extraction method for foreground digital correction of a pipeline analog-to-digital converter according to claim 4, wherein
the first conversion error is:

$$\varepsilon(n) = Dout(n) + 0.5 * \sum_{i=1}^{M} \Delta C_i(n-1) * B_i(n) + \Delta G(n-1) * D_{res}(n) - fit(n)$$

wherein M is a total number of capacitors of the current stage, Bi is a baseline state in which an $i^{th}$ capacitor is accessed, $\Delta C_i$ is capacitance mismatch, Dres is a numerical value of a residual error, $\Delta G$ is a gain error, Dout(n) is a digital output of an $n^{th}$ sampling point, and fit(n) is an ideal output value of the $n^{th}$ sampling point of the analog-to-digital converter.

6. The error extraction method for foreground digital correction of a pipeline analog-to-digital converter according to claim 4, wherein a correction value is acquired according to the following formula:

$$Dout\_cal = Dout + 0.5 * \sum_{i=1}^{M} \Delta C_i * B_i + \Delta G * D_{res} - K * \left( \sum_{i=1}^{M} B_i + \frac{M}{2} \right)$$

where Dout_cal is a numerical value after correction, Dout is a numerical value before correction, and M represents a total number of capacitors in the currently corrected stage.

7. The error extraction method for foreground digital correction of a pipeline analog-to-digital converter according to claim 1, wherein a gain error is extracted according to the following formula:

$$\Delta G(n) = \Delta G(n-1) - \mu_1 * \text{sign}(D_{res}(n)) * \varepsilon(n)$$

wherein $D_{res}$ is a numerical value of a residual error, $\mu_1$ is an iteration constant, $\Delta G$ is a gain error, and $\varepsilon(n)$ is a first conversion error.

8. The error extraction method for foreground digital correction of a pipeline analog-to-digital converter according to claim 7, wherein a correction value is acquired according to the following formula:

$$Dout\_cal = Dout + 0.5 * \sum_{i=1}^{M} \Delta C_i * B_i + \Delta G * D_{res} - K * \left( \sum_{i=1}^{M} B_i + \frac{M}{2} \right)$$

where Dout_cal is a numerical value after correction, Dout is a numerical value before correction, and M represents a total number of capacitors in the currently corrected stage.

9. The error extraction method for foreground digital correction of a pipeline analog-to-digital converter according to claim 7, wherein
the first conversion error is:

$$\varepsilon(n) = Dout(n) + 0.5 * \sum_{i=1}^{M} \Delta C_i(n-1) * B_i(n) + \Delta G(n-1) * D_{res}(n) - fit(n)$$

wherein M is a total number of capacitors of the current stage, Bi is a baseline state in which an $i^{th}$ capacitor is accessed, $\Delta C_i$ is capacitance mismatch, Dres is a numerical value of a residual error, $\Delta G$ is a gain error, Dout(n) is a digital output of an $n^{th}$ sampling point, and fit(n) is an ideal output value of the $n^{th}$ sampling point of the analog-to-digital converter.

10. The error extraction method for foreground digital correction of a pipeline analog-to-digital converter according to claim 1, wherein a kickback error is extracted through the following formulas:

$$K(n) = K(n-1) - \mu_2 * \text{sign}\left( \sum_{i=1}^{M} B_i(n) + \frac{M}{2} \right) * \varepsilon_{KB}(n)$$

$$K_1(n) = K_1(n-1) - \mu_3 * \text{sign}(Dout(n) - Dout(n-1)) * \varepsilon_{KB}(n)$$

wherein $\varepsilon_{KB}(n)$ is a second conversion error, $\mu_2$ and $\mu_3$ are iteration constants, Dout(n) represents a digital output of an $n^{th}$ sampling point, K(n) is a kickback error coefficient after the $n^{th}$ iteration, $K_1(n)$ is a fitting compensation coefficient after the $n^{th}$ iteration, and the second conversion error is acquired according to the following formula:

$$\varepsilon_{KB}(n) = \varepsilon(n) - K(n) * \left( \sum_{i=1}^{M} B_i(n) + \frac{M}{2} \right) + K_1(n) * (Dout(n) - Dout(n-1)).$$

11. The error extraction method for foreground digital correction of a pipeline analog-to-digital converter according to claim 10, wherein the input signal is a low-frequency signal.

12. The error extraction method for foreground digital correction of a pipeline analog-to-digital converter according to claim 10, wherein a correction value is acquired according to the following formula:

$$Dout\_cal = Dout + 0.5 * \sum_{i=1}^{M} \Delta C_i * B_i + \Delta G * D_{res} - K * \left( \sum_{i=1}^{M} B_i + \frac{M}{2} \right)$$

where Dout_cal is a numerical value after correction, Dout is a numerical value before correction, and M represents a total number of capacitors in the currently corrected stage.

13. The error extraction method for foreground digital correction of a pipeline analog-to-digital converter according to claim 1, wherein a correction value is acquired according to the following formula:

$$\text{Dout\_cal} = Dout + 05 * \sum_{i=1}^{M} \Delta C_i * B_i + \Delta G * D_{res} - K * \left( \sum_{i=1}^{M} B_i + \frac{M}{2} \right)$$

where Dout_cal is a numerical value after correction, Dout is a numerical value before correction, and M represents a total number of capacitors in the currently corrected stage.

14. The error extraction method for foreground digital correction of a pipeline analog-to-digital converter according to claim 1, wherein the pipeline analog-to-digital converter is an analog-to-digital converter with an original code output capability.

15. The error extraction method for foreground digital correction of a pipeline analog-to-digital converter according to claim 1, wherein the transmission curve of the pipeline analog-to-digital converter is subjected to expansion processing to obtain an expanded transmission curve, and the expansion processing comprises adjusting threshold voltages of comparators at two ends of the sub-segment 0 of the transmission curve of the pipeline analog-to-digital converter to enable a residual error signal within the sub-segment 0 to be a full amplitude signal.

16. The error extraction method for foreground digital correction of a pipeline analog-to-digital converter according to claim 1, wherein the locking the outputs of the comparators in the pipeline analog-to-digital converter comprises: completing output locking by adding an offset by means of an offset input method for a comparator through an offset trimming circuit of the comparator.

17. The error extraction method for foreground digital correction of a pipeline analog-to-digital converter according to claim 1, wherein the locking the outputs of the comparators in the pipeline analog-to-digital converter comprises: completing output locking by adopting forced setting to enable a value transmitted to a margin gain unit to be the same as a value of a comparator corresponding to the sub-segment 0.

* * * * *